United States Patent
Ide et al.

[19]

[11] Patent Number: 5,982,077
[45] Date of Patent: Nov. 9, 1999

[54] PIEZO-ELECTRIC TRANSDUCER UNIT

[75] Inventors: Toshinori Ide, Nagano; Hisao Wakabayashi, Tokyo, both of Japan

[73] Assignees: Miyota Co., Ltd., Nagano; Citizen Watch Co., Ltd., Tokyo, both of Japan

[21] Appl. No.: 08/860,630

[22] PCT Filed: Nov. 7, 1996

[86] PCT No.: PCT/JP96/03263

§ 371 Date: Jul. 3, 1997

§ 102(e) Date: Jul. 3, 1997

[30] Foreign Application Priority Data

Aug. 11, 1995 [JP] Japan ..................................... 7-316064

[51] Int. Cl.⁶ ........................ H01L 41/047; H01L 41/053
[52] U.S. Cl. ......................... 310/366; 310/348; 310/349; 310/353
[58] Field of Search .................................... 310/348, 349, 310/353, 366

[56] References Cited

U.S. PATENT DOCUMENTS

| | | | |
|---|---|---|---|
| 4,583,019 | 4/1986 | Yamada et al. | 310/348 |
| 4,757,581 | 7/1988 | Yamada et al. | 310/348 |
| 5,525,855 | 6/1996 | Gotoh et al. | 310/348 |
| 5,585,687 | 12/1996 | Wakabayashi et al. | 310/366 |
| 5,699,027 | 12/1997 | Tsuji et al. | 310/348 |
| 5,828,159 | 10/1998 | Miyagawa et al. | 310/348 |
| 5,841,217 | 11/1998 | Kizaki et al. | 310/348 |
| 5,844,348 | 12/1998 | Gamo | 310/366 |

FOREIGN PATENT DOCUMENTS

| | | | |
|---|---|---|---|
| 59-181713 | 10/1984 | Japan | 310/348 |
| 3-130618 | 12/1991 | Japan | H03H 9/02 |
| 4-298109 | 10/1992 | Japan | H03H 9/05 |
| 7-235854 | 9/1995 | Japan | H03H 9/13 |

*Primary Examiner*—Thomas M. Dougherty
*Attorney, Agent, or Firm*—Dickstein Shapiro Morin & Oshinsky, LLP

[57] ABSTRACT

An insulating substrate (1) is a laminate of a first insulating substrate (1a) and a second insulating substrate (1b) on which wires and electrodes are formed previously. In this case a concavity is formed on the insulating substrate (1) by a hollow part (4) of the first insulating substrate (1a) and an upper surface of the second insulating substrate. Metallic wires are also arranged on an area corresponding to a bottom surface of the concavity of the second insulating substrate. As a result, space for arranging metallic wires expands and a space between metallic wires can be widened. Further, metallic wires which bypass areas corresponding to external electrodes formed on a lower surface of the second insulating substrate can be formed. This results in smaller stray capacitance between an electrode and a wire and between wires.

9 Claims, 5 Drawing Sheets

PIEZO-ELECTRIC TRANSDUCER UNIT

TECHNICAL FIELD

This invention relates to a surface mounted piezo-electric transducer unit and, more particularly, to an arrangement of the internal wiring thereof.

BACKGROUND ART

In recent years, surface mounted piezo-electric transducer units which can be easily mounted on a surface of a printed-circuit board are used for piezo-electric transducers such as crystal oscillators for clocking sources of personal computers, communication devices, and the like. In these surface mounted piezo-electric transducers, the following attempted improvements are publicly known:

(1) improving the oscillation characteristic of a piezo-electric transducer corresponding to a change in temperature by changing double and support into cantilever-like support or reducing stress caused by the difference in thermal expansion between the transducer and its container.

(2) improving piezo-electric transducer production efficiency by forming on its longer sides two pairs of electrodes for connecting it to a container and thus enabling the transducer and container to be assembled regardless of the directions of their longer sides when the transducer is automatically fitted into the container.

A conventional piezo-electric transducer unit will be described below with reference to the drawings.

FIG. 1 is a perspective view of components of a conventional piezo-electric transducer unit. A piezo-electric transducer unit 100 comprises a substrate 101 of ceramic insulating materials, a thickness-mode crystal oscillator 102 (hereinafter referred to as "AT crystal oscillator 102"), and a ceramic cap 103. On an upper surface of the substrate 101, there are a rectangular concavity 104 for housing the AT crystal oscillator 102 and separating grooves 105 and 106 for separating conductive adhesives. Each of the separating grooves 105 and 106 is on opposite sides of a centerline of the substrate 101 parallel to its shorter sides. The AT crystal oscillator 102 is of the so-called convex type and has an excitation electrode 121 and outgoing electrodes 122 and 123 connected thereto, which are mounted fast on its upper and lower surfaces by vacuum evaporation, sputtering, and so forth. The AT crystal oscillator 102 may be a rectangular AT plate of uniform thickness. The AT crystal oscillator 102 is housed in the concavity 104 on the substrate 101, and the outgoing electrodes 122 and 123 are fixed, with conductive adhesives, onto connecting electrodes 107 and 110 or 108 and 109 respectively. Then frequency adjustment is performed as necessary and the cap 103 is joined onto the substrate 101, which completes the crystal oscillator unit 100.

FIGS. 2, 3, and 4 are diagrams showing the state of metallic wire on the substrate 101. FIG. 2 is a front view, FIG. 3 is a view from the direction of an arrow 130 in FIG. 2, and FIG. 4 is a rear view.

A surface (hereinafter referred to as "the mounting surface") of the substrate 101 shown in FIG. 2 is where the AT crystal oscillator 102 is mounted, and is nearly square. For convenience of the following explanation, it is assumed that a centerline of the near square parallel to its longer sides is an X-axis and that a centerline of the near square parallel to its shorter sides is a Y-axis. The concavity 104 is also nearly square and its center lines are identical to the above X- and Y-axis respectively. There are connecting electrodes at positions contiguous to four corners of the concavity 104. An X-Y plane formed by the above X- and Y-axis has four quadrants each of which has one connecting electrode. That is, the first quadrant has a first connecting electrode 107; the second quadrant has a second connecting electrode 108; the third quadrant has a third connecting electrode 109; and the fourth quadrant has a fourth connecting electrode 110.

The separating groove 105 lies both on the first quadrant and on the fourth quadrant, and is arranged between the first connecting electrode 107 and fourth connecting electrode 110 for preventing these electrodes from short-circuiting. The separating groove 106 lies both on the second quadrant and on the third quadrant, and is arranged between the second connecting electrode 108 and third connecting electrode 109 for preventing these electrodes from short-circuiting.

On the reverse of the substrate 101, as shown in FIG. 4, there are a first external electrode 111, a second external electrode 112, a third external electrode 113, and a fourth external electrode 114, the locations of which correspond to the first, second, third, and fourth quadrant on the upper surface of the above substrate 101 respectively.

The first connecting electrode 107 and second connecting electrode 108 are connected by a first metallic wire 115 and the first metallic wire 115 is connected to the second external electrode 112 by a second metallic wire 116. The second metallic wire 116 reaches from the mounting surface of the substrate 101 to the second external electrode 112 on the reverse through a side of the substrate 101 corresponding to the longer side of the mounting surface. The second connecting electrode 108 is connected to the third external electrode 113 by a third metallic wire 117. The third metallic wire 117 extends from the second quadrant having the second connecting electrode 108 to the third quadrant and reaches the third external electrode 113 through a side of the substrate 101 by bypassing the third connecting electrode 109. As described above, the first and second connecting electrodes 107 and 108 and the second and third external electrodes 112 and 113 are connected by the first, second, and third metallic wires 115, 116, and 117, which form a first group of the wiring pattern.

The third connecting electrode 109 and fourth connecting electrode 110 are connected by a fourth metallic wire 118 and the fourth metallic wire 118 is connected to the fourth external electrode 114 by a fifth metallic wire 119. The fifth metallic wire 119 reaches from the mounting surface of the substrate 101 to the fourth external electrode 114 on the reverse through a side of the substrate 101 corresponding to the longer side of the mounting surface. The fourth connecting electrode 110 is connected to the first external electrode 111 by a sixth metallic wire 120. The sixth metallic wire 120 extends from the fourth quadrant having the fourth connecting electrode 110 to the first quadrant and reaches the first external electrode 111 through a side of the substrate 101 by bypassing the first connecting electrode 107. As described above, the third and fourth connecting electrodes 109 and 110 and the fourth and first external electrodes 114 and 111 are connected by the fourth, fifth, and sixth metallic wires 118, 119, and 120, which form a second group of the wiring pattern.

In this conventional piezo-electric transducer unit, metallic wire is arranged close on the upper surface of the substrate 101. As a result a segment $m_0$ having narrow space $d_0$ between metallic wires belonging to the different groups becomes larger, as shown in FIG. 2. Metallic wires belonging to the different groups differ in electric polarity, and so large segment $m_0$ having narrow space $d_0$ between metallic wires will generate stray capacitance there. Furthermore, if the external electrodes and metallic wires arranged on the obverse and reverse of the substrate 101 belong to the different groups, stray capacitance will generate there. This stray capacitance increases equivalent parallel capacitance of the above piezo-electric transducer unit.

The equivalent parallel capacitance will be described according to equivalent circuit diagrams of a piezo-electric transducer unit of FIGS. 5 and 6. The equivalent circuit shown in FIG. 5 comprises a parallel circuit of a series circuit having an inductance L, resonance resistance value R, and capacitance value $C_1$, capacitance value Cox of the piezo-electric transducer, and the above stray capacitance value Cop between wires. In the equivalent circuit of FIG. 6, the capacitance Cox of the piezo-electric transducer and stray capacitance Cop between wires connected in parallel in the equivalent circuit of FIG. 5 are combined into one parallel capacitance value Co. The parallel capacitance value Co is given by:

$$Co=Cox+Cop \qquad (1)$$

As described above, a stray capacitance value Cop of the conventional piezo-electric transducer unit is great. Therefore, there was the problem of generating great parallel capacitance Co. When this piezo-electric transducer unit is used in an oscillation circuit, great parallel capacitance may produce the problem of delay in an oscillation start or unstable oscillation.

DISCLOSURE OF THE INVENTION

It is an object of the present invention to provide a piezo-electric transducer unit having improved characteristics by reducing stray capacitance.

In order to achieve the above object, a piezo-electric transducer unit according to the present invention is intended that external electrodes and wires having different polarities are not arranged on the obverse and reverse of a substrate. Specifically, there is a first exciting electrode on a first surface of a piezo-electric transducer and a second exciting electrode on a second surface, the back of the first surface. Furthermore, the piezo-electric transducer unit has at least one first connecting electrode connected to the first exciting electrode in the case of the piezo-electric transducer being mounted, at least one second connecting electrode connected to the second exciting electrode in the case of the piezo-electric transducer being mounted, at least one first external electrode and at least one second external electrode on the back of the mounting surface of the piezo-electric transducer, a first wire for connecting the first connecting electrode and the first external electrode, and a second wire for connecting the second connecting electrode and the second external electrode. The piezo-electric transducer unit has a cap for covering the piezo-electric transducer mounting surface of the substrate and sealing, with the substrate, the piezo-electric transducer with the piezo-electric transducer mounted on the substrate. Also, the first and second external electrodes and the first and second wires are arranged so that, when they are projected onto a plane parallel to the piezo-electric transducer mounting surface of the substrate, the shadows of the first external electrode and the second wire do not overlap and the shadows of the second external electrode and the first wire do not overlap.

This arrangement prevents external electrodes and wires having different polarities from being arranged on the obverse and reverse of a substrate, resulting in smaller stray capacitance.

Also, the substrate may have a concavity in a nearly central position of the piezo-electric transducer mounting surface for housing at least part of the piezo-electric transducer.

Also, in order to achieve the above configuration, it is good to perform wiring on the bottom surface of the concavity on the substrate. To achieve this, it is desirable that the substrate be divided into two sections and that wiring and forming electrodes be individually performed. According to a preferred aspect, the substrate is divided into a first substrate and second substrate by a plane parallel to the piezo-electric transducer mounting surface. The first substrate has a perforated aperture corresponding to the concavity, the first and second connecting electrodes, and holes perforating through the first substrate at the first and second connecting electrodes. The second substrate has the first and second external electrodes, the first and second wires, and perforating hole joints formed at positions corresponding to the perforating holes of the first substrate. Portions of the first and second wires are arranged at a position corresponding to the bottom surface of the concavity so that, when the first and second external electrodes and the first and second wires are projected onto a plane parallel to the piezo-electric transducer mounting surface of the substrate, the shadows of the first external electrode and the second wire do not overlap and the shadows of the second external electrode and the first wire do not overlap. In this way the first and second wires avoid the external electrodes.

Further, in a preferred embodiment of the present invention, the external shape of the substrate and the concavity are nearly square. Two first and two second connecting electrodes are provided arranged on the four corners of the nearly square concavity so that they are symmetrical with respect to a centerline parallel to the shorter sides of the near square. Two first and two second external electrodes are arranged on the two longer sides of the nearly square substrate with one first and second external electrode per side so that they are symmetrical with respect to a centerline parallel to the longer sides of the near square.

Further, in another embodiment of the present invention, the total area of the first wire, the first external electrode, and the first connecting electrode is equal to that of the second wire, the second external electrode, and the second connecting electrode.

Further, in still another embodiment of the present invention, the area of the first wire is equal to that of the second wire.

Further, in another piezo-electric transducer unit according to the present invention, a space between wires with different polarities is wide and only a small segment has a comparatively narrow space between wires with different polarities. To achieve this, wires are also arranged on a bottom surface of a concavity on a substrate. Specifically, there is a first exciting electrode on a first surface of a piezo-electric transducer and a second exciting electrode on a second surface, the back of the first surface. Furthermore, the substrate on which the piezo-electric transducer is mounted has a concavity in a nearly central position of a piezo-electric transducer mounting surface for housing at least part of the piezo-electric transducer. Also, the piezo-electric transducer unit has at least one first connecting electrode connected to the first exciting electrode in the case of the piezo-electric transducer being mounted, at least one second connecting electrode connected to the second exciting electrode in the case of the piezo-electric transducer being mounted, at least one first external electrode and at least one second external electrode on the back of the mounting surface of the piezo-electric transducer, a first wire for connecting the first connecting electrode and the first external electrode, and a second wire for connecting the second connecting electrode and the second external electrode. The piezo-electric transducer unit also has a cap for covering the piezo-electric transducer mounting surface of the substrate and sealing, together with the substrate, the piezo-electric transducer with the piezo-electric transducer mounted on the substrate. Also, the substrate is divided into a first substrate and second substrate by a plane parallel to the piezo-electric transducer mounting surface. The first substrate has a perforated aperture corresponding to the concavity, the first and second connecting electrodes, and holes perforating through the first substrate at the first and second connecting electrodes. The second substrate has the first and second external electrodes, the first and second wires, and perforating hole joints formed at positions corresponding to the perforating holes of the first substrate. At least part a portion of the first and second wires are arranged on the second substrate surface at positions corresponding to the bottom surface of the concavity.

In this configuration wires are also arranged on the bottom surface of the concavity on the substrate, which creates a large space for a wiring pattern and enabling space between wires of opposite polarity to be widened.

Further, in a preferred embodiment of the present invention, the external shape of the substrate and the concavity are nearly square. Two first and two second connecting electrodes are arranged on the four corners of the nearly square concavity so that they are symmetrical with respect to a centerline parallel to the shorter sides of the near square. Two first and two second external electrodes are arranged on the two longer sides of the nearly square substrate with one first and second external electrode per side so that they are symmetrical with respect to a centerline parallel to the longer sides of the near square.

Further, in another preferred embodiment of the present invention, the first and second wires do not cross a centerline parallel to the longer sides of the concavity inside the concavity.

BEST MODE FOR CARRYING OUT THE INVENTION

Figure 7:
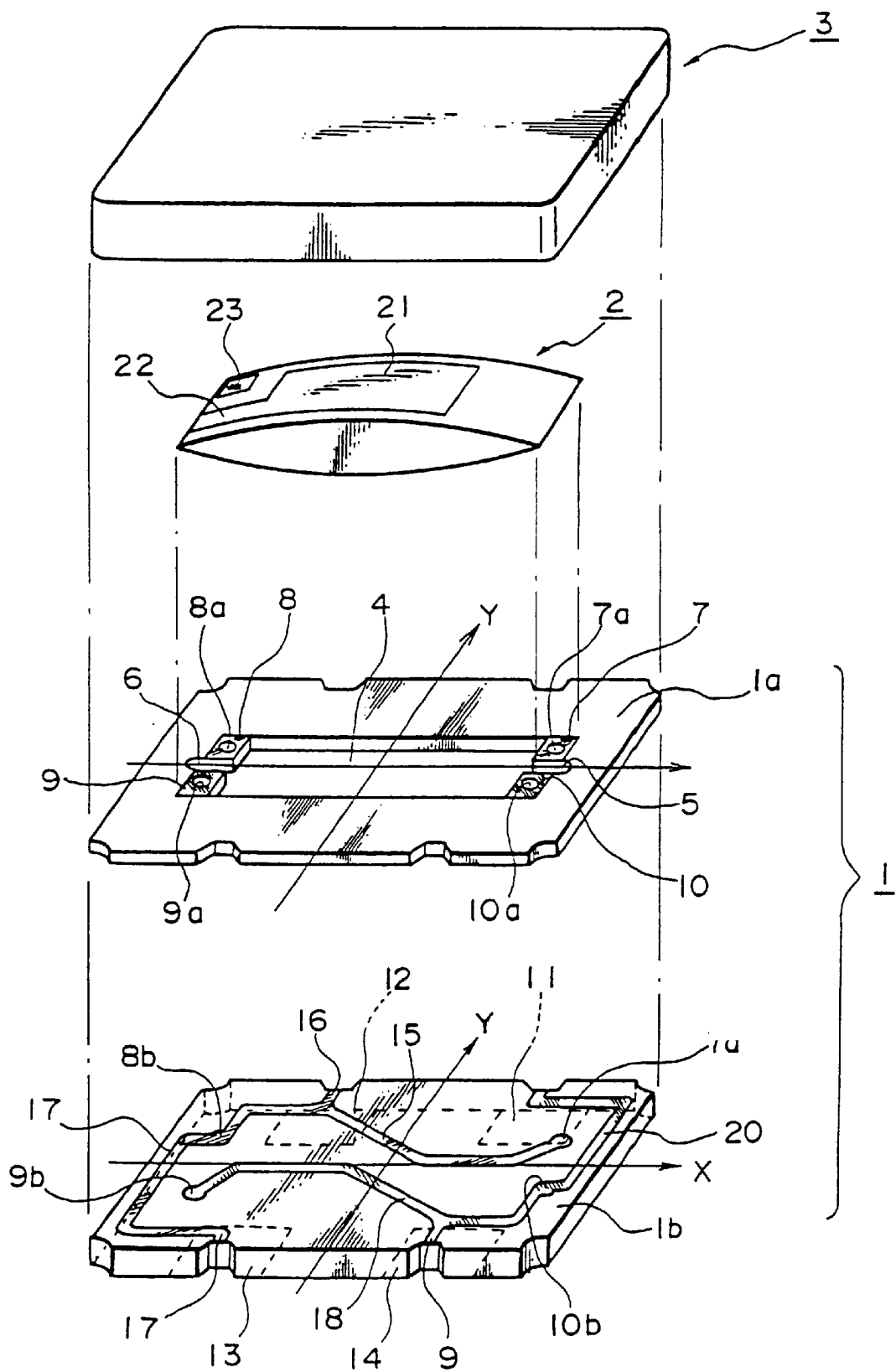
FIG. 7 is a perspective view of components of a piezo-electric transducer unit according to an embodiment of the present invention.

An embodiment of the present invention will be described below with the drawings. FIG. 7 is a perspective view of components of a piezo-electric transducer unit according to this embodiment. The piezo-electric transducer unit comprises an insulating substrate 1 of ceramic insulating materials, a thickness-mode crystal oscillator 2 (hereinafter referred to as "AT crystal oscillator 2"), and a ceramic cap 3. The insulating substrate 1 is a laminate of a first insulating substrate 1a and a second insulating substrate 1b. A junction surface of the first insulating substrate 1a and second insulating substrate 1b, an upper surface of the first insulating substrate 1a, and a lower surface of the second insulating substrate 1b are parallel to one another. The first insulating substrate 1a is thinner than the second insulating substrate 1b and has a rectangular hollow part 4 in the center. The hollow part 4 forms a concavity together with an upper surface of the second insulating substrate 1b when the first insulating substrate 1a is placed upon the second insulating substrate 1b to form the insulating substrate 1. Also, the first insulating substrate 1a has separating grooves 5 and 6 for separating conductive adhesives. The separating grooves 5 and 6 are on opposite sides of a centerline of the insulating substrate 1 parallel to its shorter sides.

The AT crystal oscillator 2 is of the so-called convex type and has connected to it an excitation electrode 21 and outgoing electrodes 22 and 23, which are mounted fast on its upper and lower surfaces by vacuum evaporation, sputtering, or the like. The AT crystal oscillator 2 may be the so-called rectangular AT plate of uniform thickness. After the first insulating substrate 1a and second insulating substrate 1b are bonded together, part of the AT crystal oscillator 2 is housed in the concavity formed on the insulating substrate 1 by the hollow part 4 and the outgoing electrodes 22 and 23 are fixed, with conductive adhesives, onto connecting electrodes 7 and 10 or 8 and 9 ( described below) respectively. As a result, the AT crystal oscillator 2 is mounted and fixed on the insulating substrate 1. The cap 3 is mounted on the insulating substrate 1 like covering the AT crystal oscillator 2. So the cap 3, together with the insulating substrate 1, seal the AT crystal oscillator 2.

In FIG. 7, the upper surface (hereinafter referred to as "the mounting surface") of the first insulating substrate 1a is where the AT crystal oscillator 2 is mounted, and is nearly square. For convenience of the following explanation, it is assumed that a centerline of the near square parallel to its longer sides is an X-axis and that a centerline of the near square parallel to its shorter sides is a Y-axis. The hollow part 4 is also nearly square and its centerlines are identical to the above X- and Y-axis respectively. There are connecting electrodes at positions contiguous to four corners of the hollow part 4. An X-Y plane formed by the above X- and Y-axis has four quadrants, each of which has one connecting electrode. That is, the first quadrant has a first connecting electrode 7; the second quadrant has a second connecting electrode 8; the third quadrant has a third connecting electrode 9; and the fourth quadrant has a fourth connecting electrode 10. These four connecting electrodes 7, 8, 9, and 10 have perforating holes 7a, 8a, 9a, and 10a, respectively. These perforating holes perforate through the first insulating substrate 1a.

The separating groove 5 lies both on the first quadrant and on the fourth quadrant, and is arranged between the first connecting electrode 7 and fourth connecting electrode 10 for preventing these electrodes from short-circuiting. The separating groove 6 lies both on the second quadrant and on the third quadrant, and is arranged between the second connecting electrode 8 and third connecting electrode 9 for preventing these electrodes from short-circuiting.

In FIG. 7, there are metallic wires on the upper surface of the second insulating substrate 1b; and a first external electrode 11, second external electrode 12, third external electrode 13, and fourth external electrode 14 on its lower surface the locations of which correspond to the first, second, third, and fourth quadrants on the above X-Y plane respectively.

Figure 8:
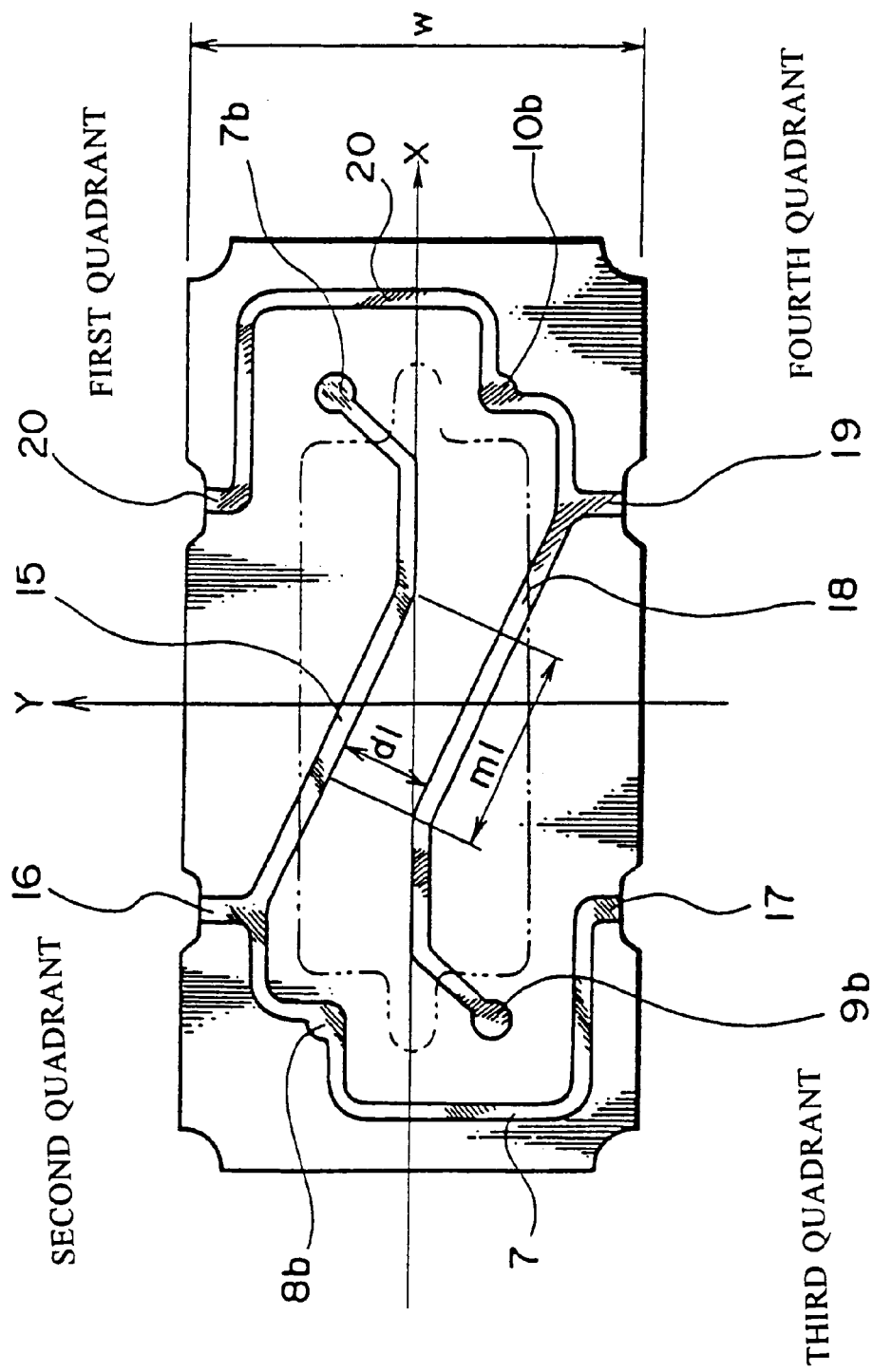
FIG. 8 is a view showing wiring and the arrangement of electrodes on a second insulating substrate of a piezo-electric transducer unit according to this embodiment.

FIG. 8 shows a pattern of the metallic wires on the upper surface of the second insulating substrate 1*b*, shown in FIG. 7, in detail. FIG. 8 shows that there are perforating hole joints 7*b*, 8*b*, 9*b*, and 10*b* on the second insulating substrate 1*b* and that, when the first insulating substrate 1*a* is placed upon the second insulating substrate 1*b*, their positions correspond to the above perforating hole 7*a*, 8*a*, 9*a*, and 10*a*, respectively.

The first perforating hole joint 7*b* and second perforating hole joint 8*b* are connected by a first metallic wire 15. The first metallic wire 15 is arranged so that it bypasses the first external electrode 11 on the lower surface of the second insulating substrate 1*b* without crossing the X-axis. This prevents the shadows of the first metallic wire 15 and first external electrode 11 projected onto a plane parallel to the above mounting surface from overlapping. The first metallic wire 15 is connected to the second external electrode 12 by a second metallic wire 16. The second metallic wire 16 reaches from the upper surface of the second insulating substrate 1*b* shown in FIG. 7 to the second external electrode 12 on its lower surface through a side corresponding to the longer side of this surface. The second connecting electrode 8 is connected to the third external electrode 13 by a third metallic wire 17 through the perforating hole 8*a* and perforating hole joint 8*b*. The third metallic wire 17 extends from the second quadrant having the second connecting electrode 8 to the third quadrant and reaches the third external electrode 13 through a side by bypassing the third perforating hole joint 9*b*. Also, after the first insulating substrate 1*a* is placed upon the second insulating substrate 1*b*, the first and second perforating hole joints 7*b* and 8*b* are connected, for example, with brazing or an adhesive to the first and second perforating hole 7*a* and 8*a* respectively. As described above, the first and second perforating hole joints 7*b* and 8*b* and the second and third external electrodes 12 and 13 are connected by the first, second, and third metallic wires 15, 16, and 17. These connecting electrodes, external electrodes, metallic wires, perforating holes, and perforating hole joints form a first group of the wiring pattern.

The third perforating hole joint 9*b* and fourth perforating hole joint 10*b* are connected by a fourth metallic wire 18. The fourth metallic wire 18 is arranged so that it bypasses the third external electrode 13 on the lower surface of the second insulating substrate 1*b* without crossing the X-axis. This prevents the shadows of the fourth metallic wire 18 and third external electrode 13 projected onto a plane parallel to the above mounting surface from overlapping. The fourth metallic wire 18 is connected to the fourth external electrode 14 by a fifth metallic wire 19. The fifth metallic wire 19 reaches from the upper surface of the second insulating substrate 1*b* shown in FIG. 7 to the fourth external electrode 14 on its lower surface through a side corresponding to the longer side of this surface. The fourth connecting electrode 10 is connected to the first external electrode 11 by a sixth metallic wire 20 through the perforating hole 10*a* and perforating hole joint 10*b*. The sixth metallic wire 20 extends from the fourth quadrant having the fourth connecting electrode 10 to the first quadrant and reaches the first external electrode 11 through a side by bypassing the first connecting electrode 7. As described above, the third and fourth perforating hole joints 9*b* and 10*b* and the fourth and first external electrodes 14 and 11 are connected by the fourth, fifth, and sixth metallic wires 18, 19, and 20.

Further, after the first insulating substrate 1*a* is placed upon the second insulating substrate 1*b*, the third and fourth perforating hole joints 9*b* and 10*b* are connected, for example, with brazing or an adhesive to the third and fourth perforating hole 9*a* and 10*a* respectively. These connecting electrodes, external electrodes, metallic wires, perforating holes, and perforating hole joints form a second group of the wiring pattern.

The above first and second group of the wiring pattern have different polarities when voltage is applied to the AT crystal oscillator 2. Also, these two groups of the wiring pattern are symmetrical in shape with respect to the intersection of the X- and Y-axis, or the origin of the X-Y plane. Therefore, characteristics of the AT crystal oscillator 2 do not depend on whether it is connected to the first connecting electrode 7 and fourth connecting electrode 10 or to the second connecting electrode 8 and third connecting electrode 9.

According to the above embodiment, metallic wires are arranged on the bottom surface of the concavity formed on the insulating substrate 1 by the hollow part 4, which gives a lot of space. As a result, space $d_1$ between metallic wires belonging to the different groups can be widened and length $m_1$ of a segment where a space between metallic wires belonging to the different groups is $d_1$ can also be shortened. Therefore, stray capacitance between metallic wires belonging to the different groups becomes smaller. In this embodiment, the first metallic wire 15 and fourth metallic wire 18 are parallelly arranged in a nearly central part of the insulating substrate 1, where a segment having a length of $m_1$ has a space of $d_1$.

The reason for arranging metallic wires on the bottom surface of the concavity formed on the insulating substrate 1 is that the insulating substrate 1 is a laminate of the first insulating substrate 1*a* and second insulating substrate 1*b* where metallic wires etc. are individually arranged.

Further, metallic wires and external electrodes are arranged so that when they are projected onto a plane parallel to the above mounting surface of the substrate, their shadows do not overlap. Therefore, stray capacitance between the metallic wires and the external electrodes becomes smaller.

Figure 1:
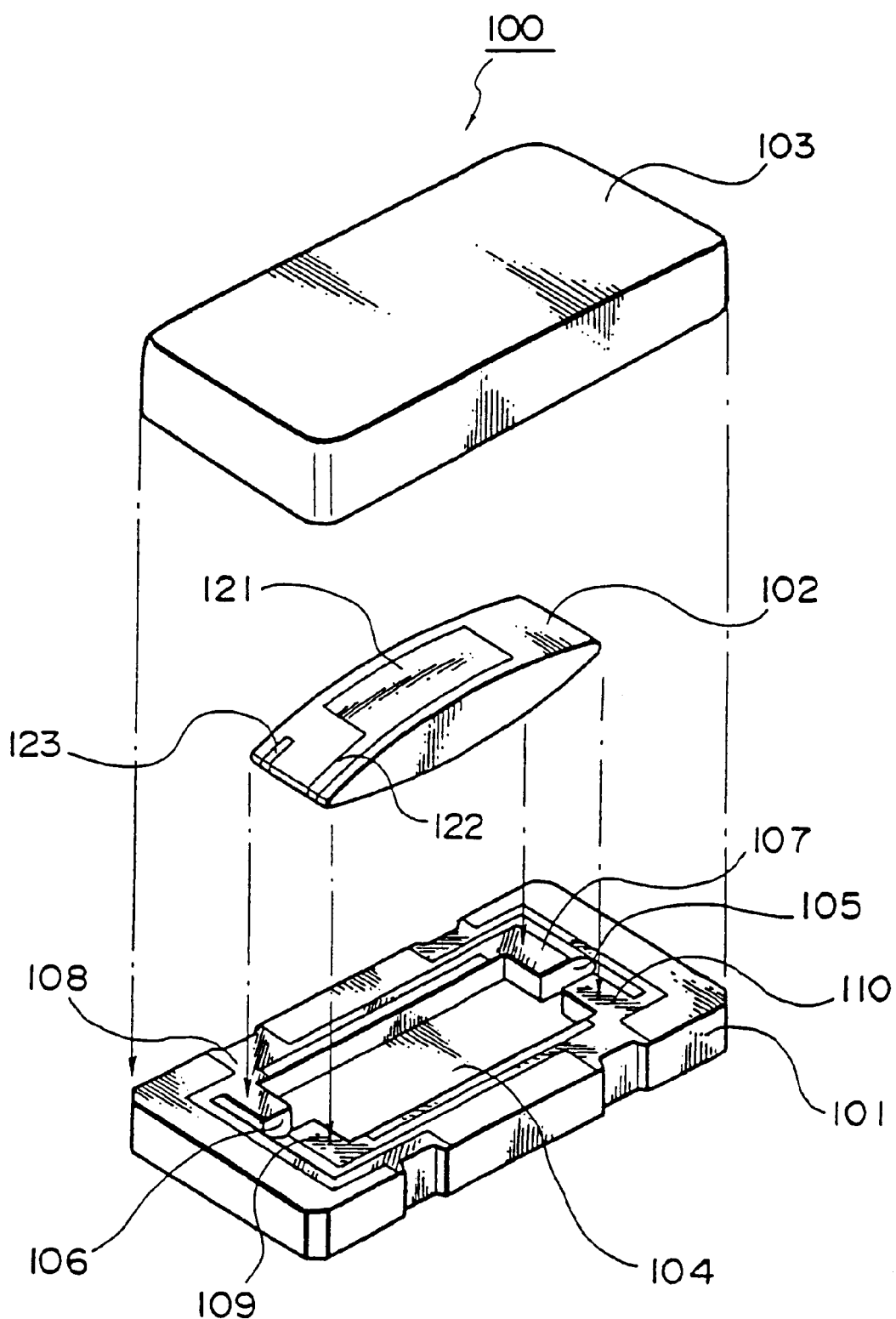
FIG. 1 is a perspective view of components of a conventional piezo-electric transducer unit.
Figure 2:
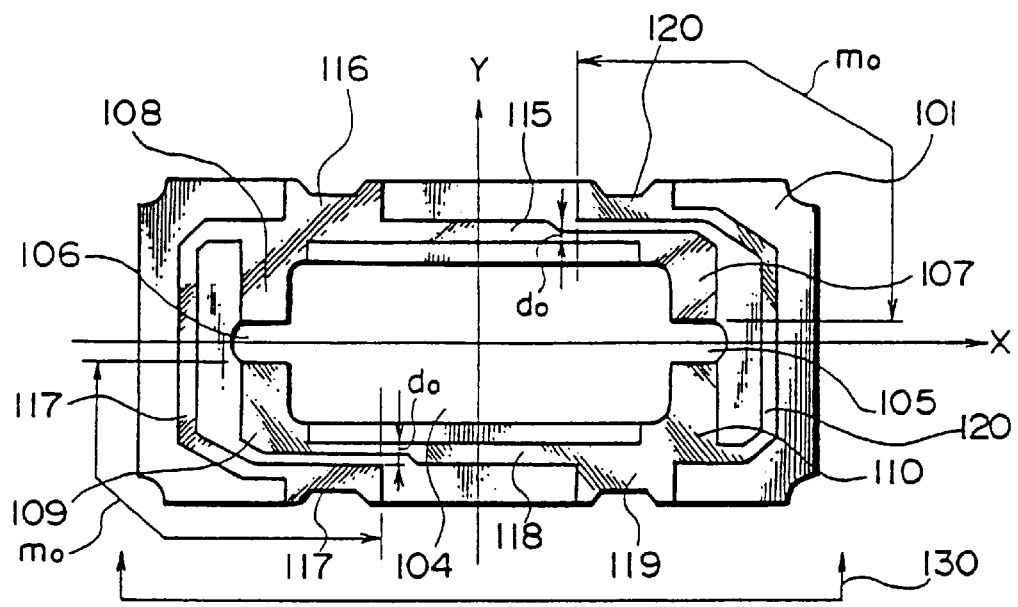
FIG. 2 is a view showing wiring and the arrangement of electrodes of a conventional piezo-electric transducer unit.
Figure 3:
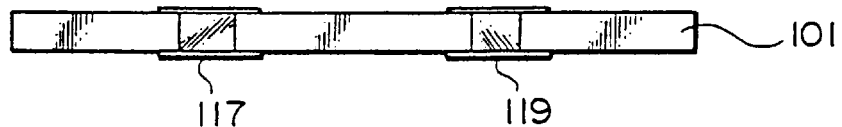
FIG. 3 is a view showing wiring and the arrangement of electrodes of a conventional piezo-electric transducer unit.
Figure 4:
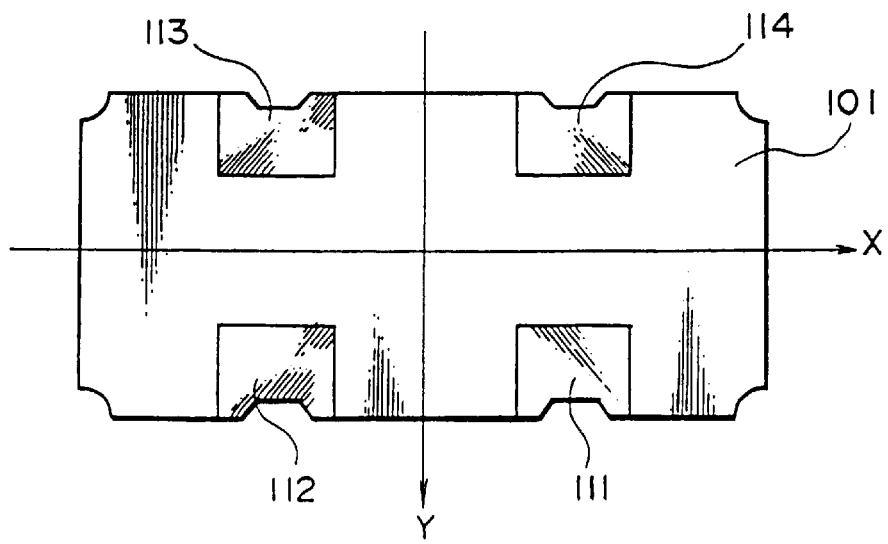
FIG. 4 is a view showing the arrangement of electrodes of a conventional piezo-electric transducer unit.
Figure 5:
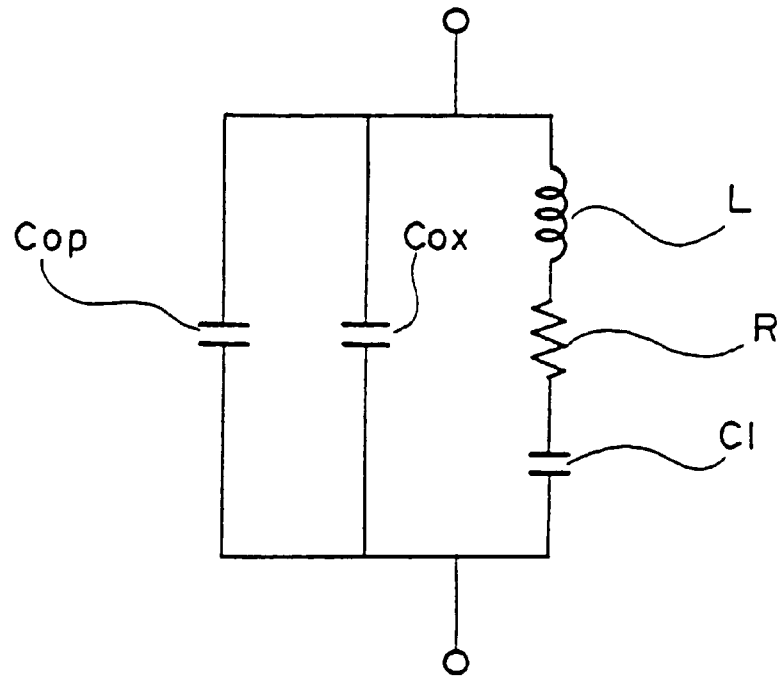
FIG. 5 is an equivalent circuit of a piezo-electric transducer unit.
Figure 6:
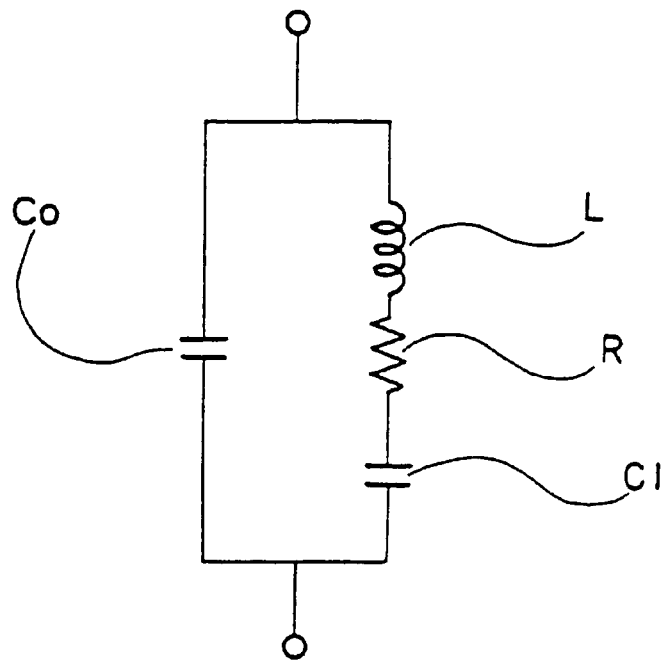
FIG. 6 is an equivalent circuit of a piezo-electric transducer unit.

This results in smaller stray capacitance Cop between wires in the equivalent circuit shown in FIG. 5, and so smaller parallel capacitance Co in the equivalent circuit shown in FIG. 6.

The first metallic wire 15 and fourth metallic wire 18 are arranged so that they do not cross the X-axis, which prevents bad insulation even if the conductive adhesive for fixing the AT crystal oscillator 2 spills onto the bottom surface of the concavity formed on the substrate.

A manufacturing experiment was conducted with a sample in which the thickness of the second insulating substrate 1*b* was 0.5–1 mm and the width 23 was 4–6 mm. The results showed that when space $d_1$ between metallic wires corresponded to ⅓–⅒ of width w of the second insulating substrate 1*b*, capacitance Cop between the wires corresponded to ⅓ of that of a conventional example. When space $d_1$ between metallic wires becomes smaller than ⅒ of width w of the second insulating substrate 1*b*, capacitance between the wires increases. And when space $d_1$ between metallic wires becomes greater than ⅓ of width w of the second insulating substrate 1*b*, capacitance between the wires increases because the shadows of the metallic wires and external electrodes of the reverse projected onto a plane overlap. As a result, when space $d_1$ between metallic wires corresponds to ⅓–¹⁄₁₀ of width w of the second insulating substrate 1b, capacitance Cop between the wires has a nearly minimum value. The thinner the second insulating substrate 1b becomes, the stronger this trend grows. Experimental results are shown in Table 1.

TABLE 1

| Equivalent circuit constant | Conventional example | Present invention |
| --- | --- | --- |
| Co (pF) | 5.0 | 4.0 |

Table 1 shows that a piezo-electric transducer according to the present invention has a smaller Co.

In the above embodiment, a concavity is formed on the insulating substrate for housing the AT crystal oscillator, but an almost plane insulating substrate may be used. In this case, wires are arranged on an AT crystal oscillator mounting area of an insulating substrate. This brings about the same effect as the above embodiment. In this case, an AT crystal oscillator which is a rectangular AT plate of uniform thickness is more desirable than a convex type.

While what has been described is, at present, considered to be the best embodiment of the invention, it will be understood that various modifications may be made thereto, and it is intended that the appended claims cover all such modifications falling within the true spirit and scope of the invention.

We claim:

1. A piezo-electric transducer unit comprising:
   a piezo-electric transducer having a first exciting electrode on a first surface and a second exciting electrode on a second surface;
   a substrate having a mounting surface for mounting said piezo-electric transducer, said substrate having at least one first connecting electrode on a first half of said mounting surface for connection to said first exciting electrode of said piezo-electric transducer, at least one second connecting electrode on a second half of said mounting surface for connection to said second exciting electrode of said piezo-electric transducer, at least one first external electrode on said second half of said substrate and at least one second external electrode on said first half of said substrate, said first external electrode being on a second surface of said substrate, said second external electrode being on said second surface of said substrate, a first wire for connecting said first connecting electrode and said first external electrode, and a second wire for connecting said second connecting electrode and said second external electrode; and
   a cap for covering the mounting surface and for sealing, together with said substrate, said piezo-electric transducer with said piezo-electric transducer mounted on said substrate,
   wherein, when said first and second external electrodes and said first and second wires are projected in a first direction onto a projection plane parallel to the mounting surface, the projected shadows of the first external electrode and the second wire do not overlap and the projected shadows of the second external electrode and the first wire do not overlap, the first direction being perpendicular to said projection plane.

2. A piezo-electric transducer unit according to claim 1, wherein said substrate has a concavity in a nearly central position of the mounting surface for housing at least part of said piezo-electric transducer.

3. A piezo-electric transducer unit according to claim 2, wherein said substrate is divided into a first substrate and second substrate by a plane parallel to the mounting surface, said first substrate has a perforated aperture corresponding to said concavity, said first and second connecting electrodes, and holes perforating through said first substrate at said first and second connecting electrodes, said second substrate has said first and second external electrodes, said first and second wires, and perforating hole joints formed at positions corresponding to the perforating holes of said first substrate, and part of said first and second wires are arranged at a position corresponding to the bottom surface of said concavity.

4. A piezo-electric transducer unit according to claim 3, wherein the external shape of said substrate and said concavity are nearly square, two of said first and two of said second connecting electrodes are arranged on the four corners of said concavity so that they are symmetrical with respect to a centerline parallel to the shorter sides of said concavity, two of said first and two of said second external electrodes are arranged on the two longer sides of said substrate with one first and second external electrode per side so that they are symmetrical with respect to a centerline parallel to the longer sides of said substrate.

5. A piezo-electric transducer unit according to claim 3, wherein the total surface area of said first wire, first external electrode, and first connecting electrode is equal to that of said second wire, second external electrode, and second connecting electrode.

6. A piezo-electric transducer unit according to claim 5, wherein the surface area of said first wire is equal to that of said second wire.

7. A piezo-electric transducer unit comprising:
   a piezoelectric transducer having a first exciting electrode on a first surface and a second exciting electrode on a second surface;
   a substrate having a mounting surface for mounting said piezo-electric transducer, a concavity in a nearly central position of the mounting surface for housing at least part of said piezo-electric transducer, at least one first connecting electrode for connection to said first exciting electrode of said piezo-electric transducer, at least one second connecting electrode for connection to said second exciting electrode of said piezo-electric transducer, at least one first external electrode and at least one second external electrode on a second surface of said substrate, a first wire for connecting said first connecting electrode and said first external electrode, and a second wire for connecting said second connecting electrode and said second external electrode; and
   a cap for covering the mounting surface of said substrate and sealing, together with said substrate, said piezo-electric transducer with said piezo-electric transducer mounted on said substrate,
   wherein said substrate is divided into a first substrate and second substrate by a plane parallel to the mounting surface, said first substrate has a perforated aperture corresponding to said concavity, said first and second connecting electrodes, and holes perforating through said first substrate at said first and second connecting electrodes, said second substrate has said first and second external electrodes, said first and second wires, and perforating hole joints formed at positions corresponding to the perforating holes of said first substrate, and at least part of said first and second wires are arranged on an area of the second substrate corresponding to the bottom surface of said concavity.

8. A piezo-electric transducer unit according to claim 7, wherein the external shape of said substrate and said concavity are nearly square, two of said first and two of said second connecting electrodes are arranged on the four corners of said nearly square concavity so that they are symmetrical with respect to a centerline parallel to the shorter sides of the near square, two of said first and two of said second external electrodes are arranged on the two longer sides of said nearly square substrate with one first and second external electrode per side so that they are symmetrical with respect to a centerline parallel to the longer sides of the near square.

9. A piezo-electric transducer unit according to claim 8, wherein said first and second wires do not cross within said concavity a centerline parallel to the longer sides thereof.

* * * * *